United States Patent [19]
Carlesi et al.

[11] Patent Number: 6,028,880
[45] Date of Patent: *Feb. 22, 2000

[54] AUTOMATIC FLUORINE CONTROL SYSTEM

[75] Inventors: Jason R. Carlesi, San Diego; Shahryar Rokni, Carlsbad; Mengxiong Gong, San Marcos; Tom A. Watson, Carlsbad; Palash P. Das, Vista; Michael C. Binder, San Diego; Muljadi Tantra, San Diego; David J. Tammadge, San Diego; Daniel G. Patterson, Morganhill, all of Calif.

[73] Assignee: Cymer, Inc., San Diego, Calif.

[ * ] Notice: This patent is subject to a terminal disclaimer.

[21] Appl. No.: 09/109,596

[22] Filed: Jul. 2, 1998

Related U.S. Application Data

[63] Continuation-in-part of application No. 09/016,525, Jan. 30, 1998, Pat. No. 5,978,406.

[51] Int. Cl.[7] .................................................... H01S 3/225
[52] U.S. Cl. ................................. 372/58; 372/57; 372/59
[58] Field of Search .......................................... 372/55–60

[56] References Cited

U.S. PATENT DOCUMENTS

| | | | |
|---|---|---|---|
| 4,031,484 | 6/1977 | Freiberg et al. | 372/59 |
| 4,429,392 | 1/1984 | Yoshida et al. | 372/9 |
| 4,722,090 | 1/1988 | Haruta et al. | 372/57 |
| 4,740,982 | 4/1988 | Hakuta et al. | 372/59 |
| 4,831,332 | 5/1989 | Rudisill et al. | 324/455 |
| 4,893,108 | 1/1990 | Kolesar, jr. | 338/34 |
| 5,005,180 | 4/1991 | Edelman et al. | 372/57 |
| 5,005,181 | 4/1991 | Yoshioka et al. | 372/59 |
| 5,017,499 | 5/1991 | Hakuta et al. | 436/124 |
| 5,064,140 | 11/1991 | Neuburger | 340/634 |
| 5,073,896 | 12/1991 | Reid et la. | 372/59 |
| 5,090,020 | 2/1992 | Bedwell | 372/59 |
| 5,149,659 | 9/1992 | Hakuta et al. | 436/55 |
| 5,377,215 | 12/1994 | Das et al. | 372/57 |
| 5,440,578 | 8/1995 | Sandstrom | 372/59 |
| 5,450,436 | 9/1995 | Mizoguchi et al. | 372/59 |
| 5,642,374 | 6/1997 | Wakabayashi et al. | 372/57 |

FOREIGN PATENT DOCUMENTS

| | | |
|---|---|---|
| 3-135089 | 6/1991 | Japan . |
| 3-194991 | 8/1991 | Japan . |
| 3-57632 | 9/1991 | Japan . |
| 4-029385 | 1/1992 | Japan . |
| 4-29386 | 1/1992 | Japan . |
| 4-120782 | 4/1992 | Japan . |
| 4-334079 | 11/1992 | Japan . |
| 5-291650 | 11/1993 | Japan . |
| 5-347448 | 12/1993 | Japan . |
| 7-122800 | 5/1995 | Japan . |

*Primary Examiner*—John D. Lee
*Attorney, Agent, or Firm*—John R. Ross, Esq.

[57] ABSTRACT

An excimer laser system with a fluorine control having a fixed volume inject bottle in which fluorine is injected prior to it being injected into the laser chamber. A manifold and feedback control system is provided to permit precise injection at rates approaching continuous fluorine injection. The system permits the laser to be operated in a small sweet spot as measured by a narrow range of charging voltage.

19 Claims, 11 Drawing Sheets

AUTOMATIC FLUORINE CONTROL SYSTEM

This application is a continuation-in-part of Ser. No. 09/016,525 filed Jan. 30, 1998 now U.S. Pat. No. 5,978,406 issued Nov. 2, 1999, entitled "Fluorine Control System for Excimer Laser". This invention relates to excimer lasers and in particular for equipment and methods for controlling laser gas in excimer lasers.

BACKGROUND OF THE INVENTION

Excimer lasers are well known. An important use of excimer lasers is to provide the light source for integrated circuit lithography. The type of excimer laser currently being supplied in substantial numbers for integrated circuit lithography is the KrF laser which produces ultraviolet light at a wavelength of 248 nm. A similar excimer laser, the ArF laser, provides ultraviolet light at 193 nm. These lasers typically operate in a pulse mode at pulse rates such as 1,000 Hz. The laser beam is produced in a laser chamber containing a gain medium created by the discharge through a laser gas between two elongated electrodes of about 28 inches in length and separated by about 5/8 inch. The discharge is produced by imposing a high voltage such as about 20,000 volts across the electrodes. For the KrF laser, the laser gas is typically about 1% krypton, 0.1% fluorine and about 99% neon. For the ArF laser the gas is typically about 3 to 4% argon, 0.1% fluorine and 96 to 97% neon. In both cases in order to achieve high pulse rates of about 1,000 Hz, the gas must be circulated between the electrodes at speeds of about 500 to 1,000 inches per second.

Fluorine is the most reactive element known and it becomes even more reactive when ionized during the electric discharge. Special care must be exercised to utilize in these laser chambers materials such as nickel coated aluminum which are reasonably compatible with fluorine. Further, laser chambers are pretreated with fluorine to create passification layers on the inside of the laser chamber walls. However, even with this special care, fluorine will react with the walls and other laser components which results in a relatively regular depletion of the fluorine. The rates of depletion are dependent on many factors, but for a given laser at a particular time in its useful life, the rates of depletion depend primarily on the pulse rate and load factor if the laser is operating. If the laser is not operating, the depletion rate is substantially reduced. The rate of depletion is further reduced if the gas is not being circulated. To make up for this depletion, new fluorine is typically injected at intervals of about 1 to 3 hours. Rather than inject pure fluorine it is a typical practice to inject into KrF lasers a mixture of 1% fluorine, 1% krypton and 98% neon. For example, in a typical 1000 Hz KrF excimer laser used for lithography, the quantity of its fluorine, krypton, neon mixture injected to compensate for the fluorine depletion varies from about 10 scc per hour when the laser is not operating and the laser gas is not being circulated to about 500 scc per hour when the laser is running continuously at 1000 Hz. The typical injection rate is about 120 scc per hour when the chamber fan is circulating the laser gas, but the laser is not firing.

The unit "scc" refers to "standard cubic centimeters". Other commonly used units for describing quantities of fluorine in a particular volume are percent (%) fluorine, parts per million and kilo Pascals; the latter term sometimes refers to the partial pressure of the fluorine gas mixture. (This is because the amount of fluorine injected into a laser chamber is typically determined (directly or indirectly) by the measured chamber pressure increase while the 1% fluorine gas mixture is being injected.) A 320 scc per hour injection rate of the 1% fluorine mixture would correspond to a depletion in the fluorine concentration over 2 hours from about 0.10 percent to about 0.087 percent. The actual quantity of fluorine depleted in two hours as measured in grams of pure fluorine would be about 10 milligrams during the two hour period corresponding to the above 320 scc/hour injection rate (i.e., 640 scc of the 1% fluorine mixture injected at two-hour intervals) of the fluorine gas mixture.

For integrated circuit lithography a typical mode of operation requires laser pulses of constant pulse energy such as 10 mJ/pulse at about 1000 Hz which are applied to wafers in bursts such as about 300 pulses (with a duration of about 300 milliseconds) with a dead time of a fraction of a second to a few seconds between bursts. Modes of operation may be continuous 24 hours per day, seven days per week for several months, with scheduled down time for maintenance and repairs of, for example, 8 hours once per week or once every two weeks. Therefore, these lasers must be very reliable and substantially trouble-free.

In typical KrF and ArF excimer lasers used for lithography, high quality reproducible pulses with desired pulse energies of about 10 mJ/pulse may be obtained over a substantial range of fluorine concentration from about 0.08 percent (800 parts/million or about 24 kPa partial pressure of the fluorine gas mixture) to about 0.12 percent (1,200 parts/million or about 36 kPa). Over the normal laser operating range the discharge voltage required to produce the desired pulse energy increases as the fluorine concentration decreases (assuming other laser parameters remain approximately constant). FIG. 1 shows the typical relationship between discharge voltage and fluorine concentration for constant pulse energy of 10 mJ and 14 mJ. The discharge voltage in the range of 15 kv to 200 kv is typically controlled by a feedback system which calculates a charging voltage (in the range of about 550 volts to 800 volts) needed to produce (in a pulse compression-amplification circuit) the needed discharge voltage which is needed to produce the desired laser pulse energy. This feedback circuit therefore sends a "command voltage" signal in the range of (550 volts to 800 volts) to a power supply to provide charging voltage pulses.

Prior art techniques typically utilize the relationship between discharge voltage and fluorine concentration to maintain constant pulse energy despite the continuous depletion of fluorine. The discharge voltage of prior art excimer lasers can be changed very quickly and accurately and can be controlled with electronic feedback to maintain constant pulse energy. Accurate and precise control of fluorine concentration in the past has proven difficult. Therefore, in typical prior art KrF and ArF laser systems, the fluorine concentration is allowed to decrease for periods of about 1 to 4 or 5 hours while the discharge voltage is adjusted by a feedback control system to maintain constant pulse energy output. Periodically at intervals of about 1 to a few hours, fluorine is injected during short injection periods of a few seconds. Thus, in normal operations fluorine concentration gradually decreases from (for example) about 0.10 percent to about 0.09 percent over a period of about 1 to a few hours while the discharge voltage is increased over the same period from for example about 600 volts to about 640 volts. The injection of fluorine at the end of the 1 to a few hour period (when the voltage has drifted up to about 640 volts) brings the fluorine concentration back to about 0.10 percent and the feedback control (maintaining constant pulse energy) automatically reduces the voltage back to 600 volts.

This basic process is typically repeated for several days. Since contamination gradually builds up in the laser gas over a period of several days, it is usually desirable to replace substantially all of the gas in the laser with new laser gas at intervals of about 5–10 days. FIG. 2 describes the prior art fluorine injection technique discussed above. The voltage values represent average values of control voltage commands and indirectly represent average values of charging voltage.

The above-described prior art technique is effectively used today to provide long term reliable operation of these excimer lasers in a manufacturing environment. However, several laser parameters, such as bandwidth, beam profile and wavelength, are adversely affected by the substantial swings in the discharge voltage and fluorine concentration.

A substantial number of techniques have been proposed and patented for measuring and controlling the fluorine concentration in excimer lasers to within more narrow limits than those provided under the above described prior art technique. These techniques have generally not been commercially pursued.

What is needed is a better system and method for dealing with the issue of fluorine depletion in KrF and ArF excimer lasers.

SUMMARY OF THE INVENTION

The present invention provides an excimer laser system with an automatic fluorine control system to permit precise control of the fluorine concentration within the laser chamber.

Fluorine Concentration Sweet Spot

Applicants have discovered that the beam parameters such as pulse energy stability, wavelength stability and band width are very sensitive to changes in the fluorine concentration. They have also learned from experience that as a laser ages the fluorine concentration which provides the best combination of beam parameters may vary. Also, as stated in the background section, it is well known that at a particular point in the life of a laser, an increase in the fluorine concentration will result in a decrease in the discharge voltage and that laser life is shortened by both high discharge voltage and by high fluorine concentration. Thus, there is a need for careful selection of the fluorine concentration both for the purposes of assuring good beam parameters and achieving long laser lifetimes. This selection involves intelligent tradeoff decisions, and once those tradeoff decisions are made a fluorine concentration "sweet spot" is determined which represents the most desirable range of fluorine concentration. When this sweet spot determination has been made, it is important to operate the laser within the fluorine concentration sweet spot. This is done in two preferred embodiments by providing a fluorine monitor which monitors the fluorine concentration and provides a feedback signal to an automatic control system to operate the laser within the sweet spot. Other embodiments of the invention utilize other laser parameters to automatically and precisely control the fluorine concentration without the need to actually measure the fluorine concentration.

Precise Automatic Control

In preferred embodiments a fixed volume inject bottle is provided into which fluorine is injected prior to the fluorine being injected into the laser chamber. A manifold and feedback control system is provided which can be utilized to permit precise injection at rates approaching continuous fluorine injection.

In another preferred embodiment, a fixed predetermined quantity of fluorine $\Delta F$ is injected when the charging voltage has increased by a fixed predetermined number of volts $\Delta V$ since the most recent injection. This causes the laser to seek a sweet spot on a curve of charging voltage vs. fluorine concentration corresponding to the slope $\Delta V/\Delta F$ which corresponds to the desired sweet spot fluorine concentration. Thus, the fluorine concentration can be determined for any laser or for a particular laser at any point in its life by carefully selecting and controlling $\Delta V$ and $\Delta F$. For example, in a preferred embodiment $\Delta V$ is chosen as 40 volts and $\Delta F$ is chosen as 4 kPa providing a slope of $\Delta V/\Delta F$ of 10 V/kPa which in a particular laser corresponds to a fluorine concentration corresponding to a pure fluorine partial pressure of about 285 Pa.

DETAILED DESCRIPTION OF PREFERRED EMBODIMENTS

Preferred embodiments of the present invention can be described by reference to the figures.

EMBODIMENTS WITH FLUORINE MONITOR

First Preferred Embodiment

Figure 1:
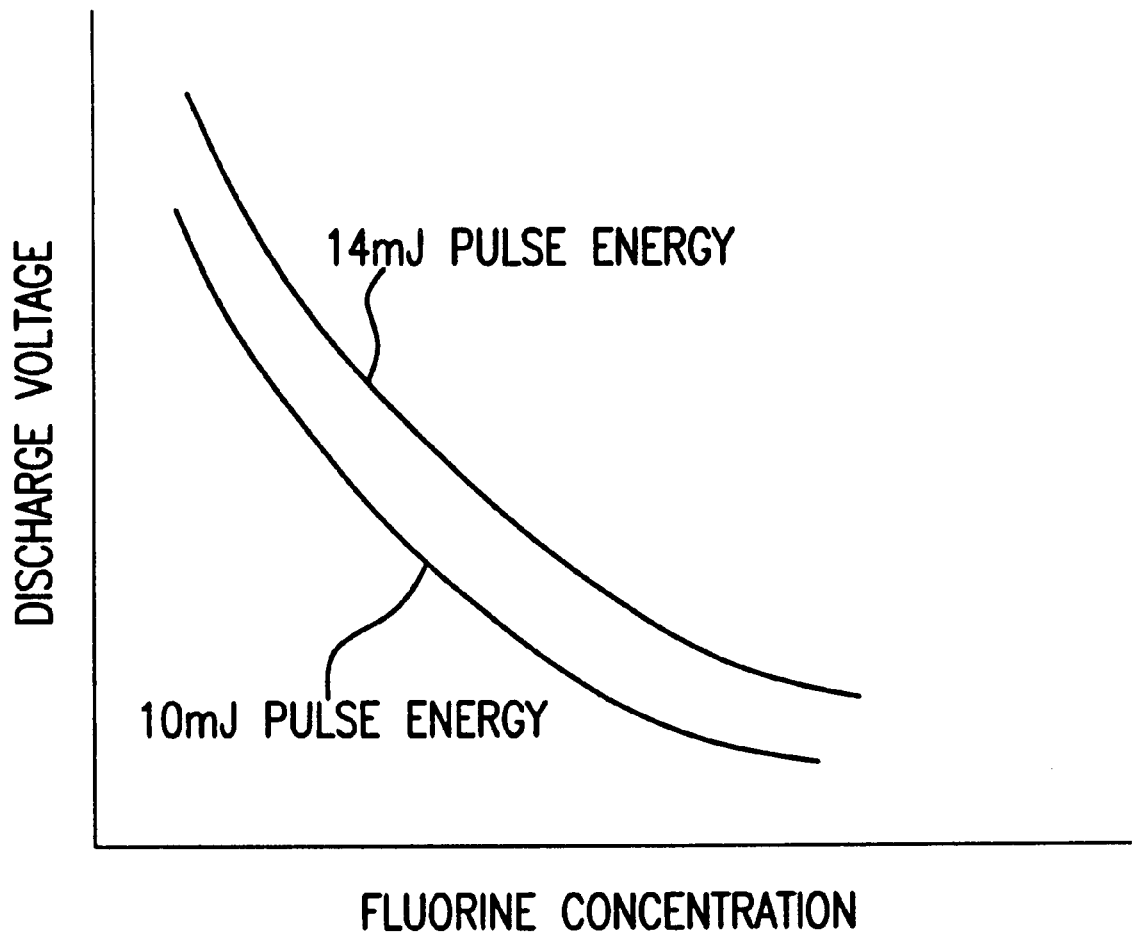
FIG. 1 is a graph showing the typical relationship between discharge voltage and fluorine concentration in a typical commercial KrF or ArF excimer laser.
Figure 3:
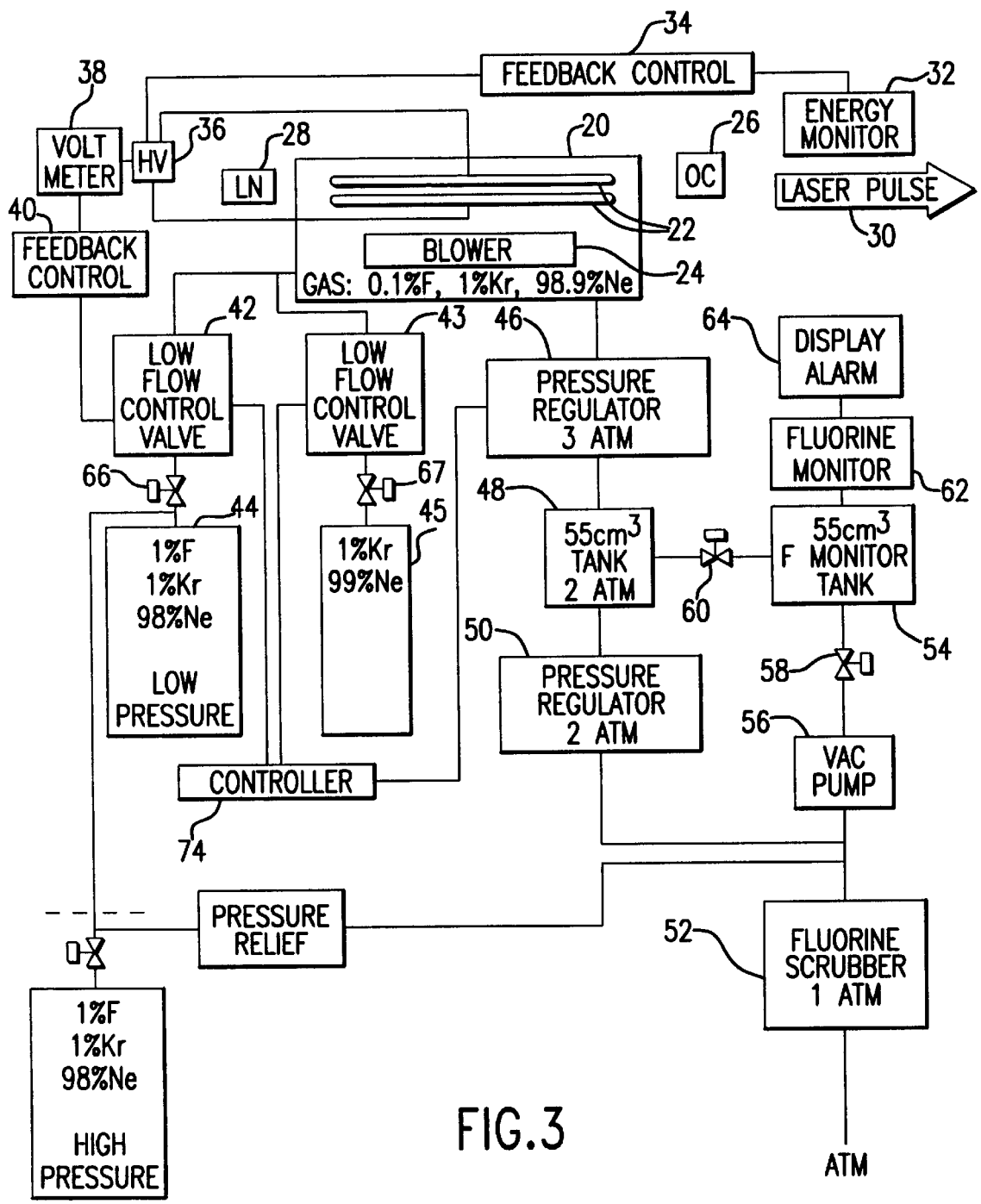
FIGS. 3–9 are block diagrams demonstrating preferred embodiments of the present invention.

A first preferred embodiment shown in FIG. 3 uses the control voltage as a real time measure of the fluorine concentration, taking advantage of the relationship shown in FIG. 1 between discharge voltage (which is proportional to control voltage) and fluorine concentration. The fluorine concentration is actually measured periodically with a fluorine monitor 62 as a calibration check. Fluorine is injected continuously to maintain fluorine concentration substantially constant over extended time periods.

The principal elements of this preferred embodiment are shown in FIG. 3. A KrF excimer laser system depicted in FIG. 3 comprises conventional laser chamber 20 containing two elongated electrodes 22 and a laser gas comprised approximately of 0.1% fluorine, 1% krypton and 98.9% neon. The gas is circulated through electrodes 22 by squirrel cage blower 24 at speeds of about 1000 inches per second which permits the laser to operate in a pulse mode at rates of 1000 Hz. A resonance chamber is defined by output coupler 26 and line narrowing module 28. The energy of each laser pulse 30 is monitored by energy monitor 32. Feedback control circuit 34 controls the discharge voltage of high voltage source 36 in order to maintain the pulse energy of laser pulses 30 at desired levels notwithstanding minor variation of elements or conditions within the resonance cavity including very small variations in the fluorine concentration.

Voltmeter 38 monitors the charge voltage of high voltage source 36 and provides a signal to feedback control circuit 40 which provides a control signal to low flow control valve 42 in order to increase or decrease the continuous fluorine injection rate from gas bottle 44 as necessary to maintain the high voltage within a desired narrow range. The feedback control circuit 40 is programmed to reduce the flow rate to a minimal long-term, dead-time flow rate when there have been no discharges during a predetermined period such as about 3 minutes. Gas bottle 44 contains a gas made up of about 1% fluorine, 1% krypton and 98% neon. The effect of such control of the fluorine injection flow is to maintain the fluorine concentration essentially constant over time periods of several days or weeks. Over longer periods due to general deterioration of the laser gas and other laser components, either the fluorine concentration or the discharge voltage, or both, must increase in order to maintain constant energy laser pulses. In this embodiment, the fluorine concentration is measured by fluorine monitor 62 at intervals of about 8 hours. Pressure regulator 46 maintains the pressure in chamber 20 at 3 atmospheres by releasing gas into fluorine monitor tank 48 which in turn is maintained at 2 atmospheres by pressure regulator 50. The output of pressure regulator 50 goes to fluorine scrubber 52 and the scrubbed gas is released into the atmosphere. About once per shift (about 8 hour intervals) fluorine is admitted to the fluorine monitor by opening valve 60. Fluorine monitor 62 then measures the fluorine concentration in the gas contained in fluorine monitor tank 48. The fluorine concentration is displayed on display panel 64 which contains an alarm function which operates if the concentration is above a set point set by the laser operator.

The output of fluorine monitor 62 is used to calibrate voltmeter 38 to provide direct indication of fluorine concentration. Voltmeter 38 will provide this indication only when the laser is operating. Therefore, when the laser is not in use, it may be desirable to periodically (such as once per 20 minutes) to fire the laser for a few pulses in order to provide a substantially continuous real time indication of fluorine concentration for the fluorine injection flow control so that the fluorine concentration in the chamber can be maintained at desired concentrations during dead times.

If the laser is scheduled for a down time of more than a few hours, gas bottle 44 may be isolated by closing valve 66. In this case, when operation is resumed valve 66 is opened and sufficient gas is injected into chamber 20 from gas bottle 44 and, if necessary, bottle 45 to establish the fluorine concentration at the desired level. A few test pulses may be produced to check the discharge voltage level for an indication of proper fluorine concentration. Also, two or three fluorine discharge samples could be taken and monitored by monitor 62 for a calibration check. The operator determines based on the data when the fluorine concentration is within an appropriate range to permit operation to resume. Alternatively, the laser controls could be programmed to make this determination automatically and when the laser is ready produce a "laser ready signal".

Most of the equipment depicted in FIG. 3 is prior art excimer laser equipment including energy monitor 32 and feedback control circuit 34. Feedback control circuit 40, low flow control valve 42 and 43, and pressure control valves 46 and 50 are new. All of the equipment should be fluorine compatible. Valve 42 should be capable of providing continuous flows at any called for flow rate (from less than 1 scc to 30 scc) from a 80 psig source 44 into 3-atmosphere laser chamber 20. A good choice for such a valve is Unit Instruments Model 1661 mass flow controller available from Unit Instruments, Inc. with offices in Yorba Lindsa, Calif. Their controller is capable under these conditions of providing control gas flows within the required range. This range is sufficient for typical KrF and ArF lasers over their operating lifetime. The typical fluorine injection rate during down times (no discharge) ranges from less than 1 scc with no gas circulation to about 2 scc with gas circulation. At 1,000 Hz continuous operation, the injection rate would typically be within a range of about 8 scc. Actual fluorine depletion rates also vary somewhat from laser to laser and as a function of laser chamber life. Generally, fluorine depletion rates increase with increasing chamber life. The Model 1661 mass flow controller contains a flow indicator so that the laser operator may monitor injection rates and take appropriate action if the injection rates are different from expected depletion rates for fluorine.

Gas fluorine monitor 62 in this embodiment is a commercially available fluorine monitor system, Model CFA 300C available from Central Engineering Company, Inc. with offices in Yamaguchi, Japan.

Second Preferred Embodiment

A second preferred embodiment of the present invention can be described by reference to FIG. 4. This system includes:

(1) chamber 20
(2) two replaceable laser gas supply cylinders, a F—Kr—Ne cylinder 70 containing a mixture of 1% F, 1% Kr and 98% Ne, and a Kr—Ne cylinder 72 containing a mixture of 1% Kr and 99% Ne
(3) a chamber fluorine/pressure control system 74
(4) a fluorine monitor 76
(5) a pressure control valve 78
(6) a pressure transducer 80
(7) a fluorine scrubber 82
(8) a vacuum pump 84
(9) high and low flow mass flow controller 86 and 88 for controlling flow from the F—Kr—Ne cylinder and high and low flow mass flow controllers 90 and 92 for controlling the flow from the Kr—Ne cylinder.

The initial fill of the chamber is directed by control system 74 through high flow controllers 90 and 86. After the chamber is filled to a pressure set point of about 3 atmospheres as detected by transducer 80, the controller switches the flow through the low flow mass flow controllers 88 and 92. As the pressure exceeds 3 atmospheres, controller 74 causes pressure control valve 78 to bleed down the chamber through fluorine monitor 76 so as to measure the fluorine concentration. If the fluorine concentration needs to be adjusted, the control system will do so by adjusting flows through controllers 88, 92 and 78 until the fluorine concentration in the chamber is the desired concentration of about 0.1 percent (1,000 parts per million). After the chamber is filled to the desired concentration, the fluorine concentration is monitored continuously or substantially continuously by monitor 76 and the results are fed to control system 74 which regulates flow controllers 88, 92 and 78 to maintain the concentrations of $F_2$, Kr and Ne at the desired levels and to maintain the total gas pressure at a desired value or at desired values. During downtimes input and discharge gas flows and monitoring are slowed down by control system 74 based on expected lower fluorine depletion.

Preferred mass flow controllers are available from suppliers such as Unit Instruments, Inc. with offices in Yorba Linda, Calif. Their Model 1661 is suitable for the low flow controllers and their Model 3161 is suitable for the high flow controllers. Pressure control is preferably provided with a pressure flow control module such as a Type 250B control module supplied by MKS Instruments having offices in Andover, Mass. An $F_2$ monitor suitable for this embodiment is Model CFA-300 C provided by Central Engineering Co., Inc. with offices in Ube City, Yamaguchi Perfecture 755, Japan. This monitor measures fluorine using a chemical reaction in which oxygen is released and measured and it is substantially a real time monitor. U.S. Pat. No. 5,017,499 (incorporated herein by reference) describes said process. Therefore, the output of this monitor can be used as in a feedback control system to control injection from sources 70 and 72. Alternatively, it may be preferable to utilize another indicator as the real time monitor of fluorine concentration and to use the Model CFA-300 C $F_2$ monitor to periodically measure the fluorine concentration and to calibrate the real time monitor. As in the first embodiment, the discharge voltage at known pulse energies can be used as the real time measure of fluorine concentration.

An alternative version of this embodiment is to program the controller to inject fluorine after a selected number of pulses. The control system measures calls for a measurement of the fluorine concentration after the selected number of pulses, calculates the consumption and automatically injects the required quantity of $F_2$ based on the calculated consumption in order to keep $F_2$ within a desired sweet spot. Applicants have successfully tested this control method using a version of Labview programming software. Labview is available from National Instruments with offices in Austin, Tex. but other programming software could be used.

The mass flow controllers can be calibrated by monitoring the rate of rise of the pressure in the chamber during refills. This operation could be performed manually by the operator or the system could be programmed to perform this calibration automatically and periodically.

EMBODIMENTS WITHOUT FLUORINE MONITOR

Third Preferred Embodiment

Figure 4:
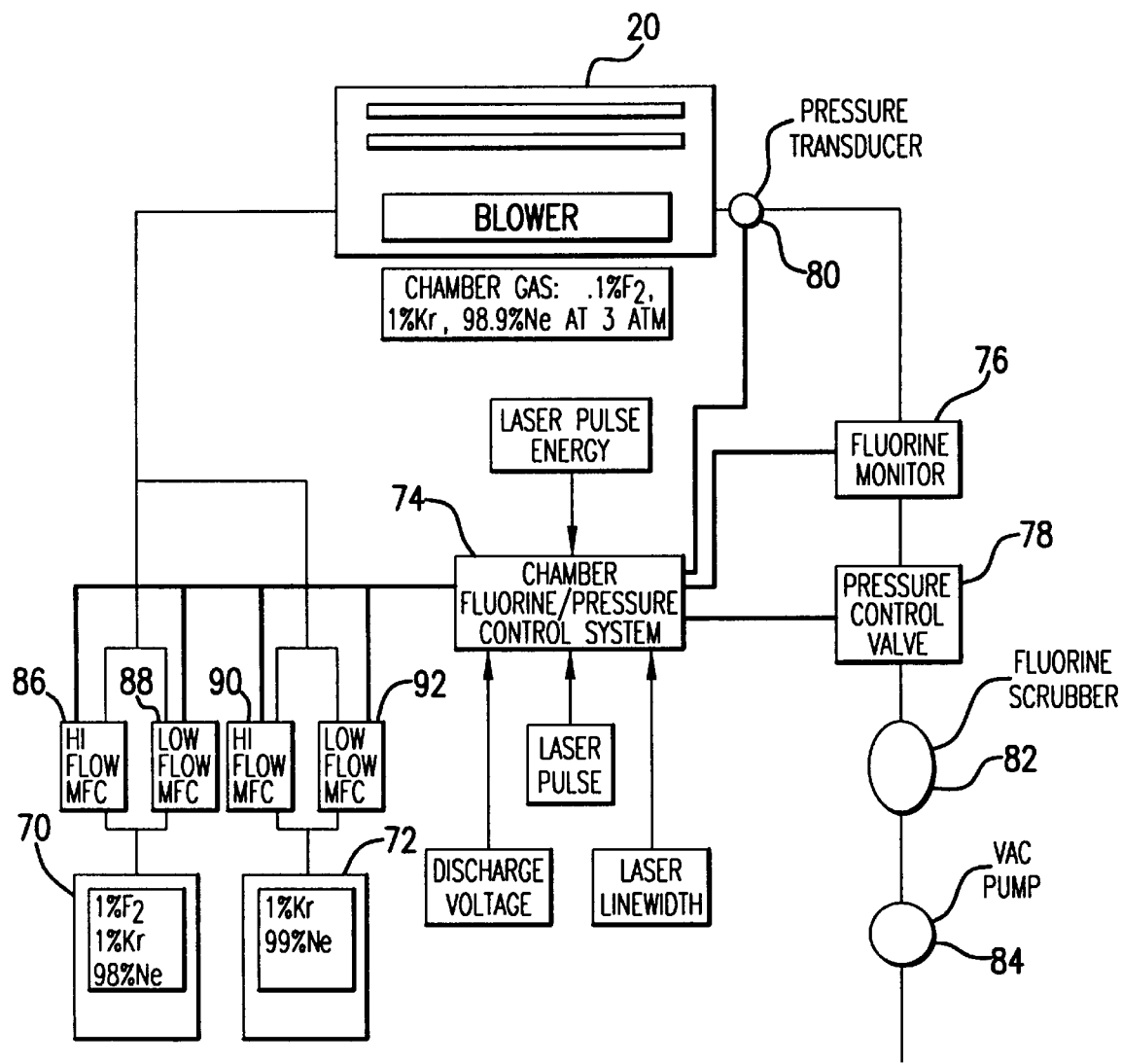

Fluorine monitors as shown as 62 in FIG. 3 and 76 in FIG. 4 are typically complicated devices and typically costs several thousand dollars. A third preferred embodiment permits operation within a chosen sweet spot without the use of a fluorine monitor. This embodiment can be described by reference to FIG. 5 which represents a state of the art KrF excimer laser chamber 1 of the type currently used for integrated circuit lithography, with a gas control system according to the present invention.

Fluorine Depletion

Laser chamber 1 comprises 20.3 liters of laser gas. Nominally as described above, the constituents are 1.0 percent krypton, 0.1 percent fluorine and the remainder neon. The 0.1 percent fluorine represents a volume of about 0.0020 liters or 2 ml of fluorine at 3 atm. In mass terms the nominal amount of fluorine in the laser chamber is about 8 grams (81 mg). The partial pressure of the fluorine is about 280 Pa, pure fluorine (corresponding to about 28 kPa of the 1% fluorine mixture). During normal operations with the laser operating at a duty factor of about 40 percent (which is typical for a lithography laser) fluorine is depleted at a rate of about 3.3 mg per hour (this corresponds to about 5% of the fluorine in the chamber per hour). In terms of partial pressure of pure fluorine, this normal depletion rate of fluorine is about 1.45 Pa per hour. To make up for this depletion using the 1% fluorine gas mixture, a volume of the mixture equivalent to about 1.15 kPa per hour is added to the chamber.

As stated in the background section, the fluorine depletion rate is far from constant. If the laser fan is operating but no lasing is taking place the fluorine depletion rate is cut approximately in half. If the fan is shutdown the fluorine depletion rate is cut to about ¼ the 40% duty factor depletion rate. At 100% duty factor the depletion rate is about double the 40% duty factor depletion rate.

Temperature Compensation

Scaling all gas pressure readings to a common temperature eliminates temperature effects when comparing gas functions such as bleeds or injects that occur at different times or on different systems. Gas pressures at arbitrary temperatures may also be scaled to produce the equivalent pressures at operating temperature. Temperature compensation can be added into gas-function software to produce more consistent gas pressures under operating conditions.

For a fixed number of moles of gas in a closed volume, the ratio P/T (absolute pressure over absolute temperature) is constant. If we define pressure at a reference temperature ($P_{ref}$ and $T_{ref}$, respectively) and then change the temperature, we have $$P_{ref}/T_{ref}=P/T$$

so that either $$P_{ref}=P*T_{ref}/T \quad (1)$$

or $$P=P_{ref}*T/T_{ref} \quad (2)$$

In both cases, the pressure P at temperature T corresponds to the pressure $P_{ref}$ at temperature $T_{ref}$. Equation (1) scales a pressure reading back to the reference temperature $T_{ref}$, for example in comparison of pressures recorded at different temperatures. Equation (2) scales a desired pressure at $T_{ref}$ to the equivalent pressure at the current temperature T, which would be used in setting pressure targets for gas functions. For example, assume the desired pressure from a gas fill is 290 kPa at 50° C. (323.2° K.), and the chamber temperature is 27° C. (300.2° K.). Equation (2) yields a corrected target pressure of P=(290 kPa)(300.2)/(323.2)= 269 kPa. If the chamber is filled to this initial pressure at 27° C., the pressure at a temperature of 50° C. will be 290 kPa, as desired.

Discharge Voltage vs. Fluorine Concentration for Constant Pulse Energy "Sweet Spot"

Figure 2:
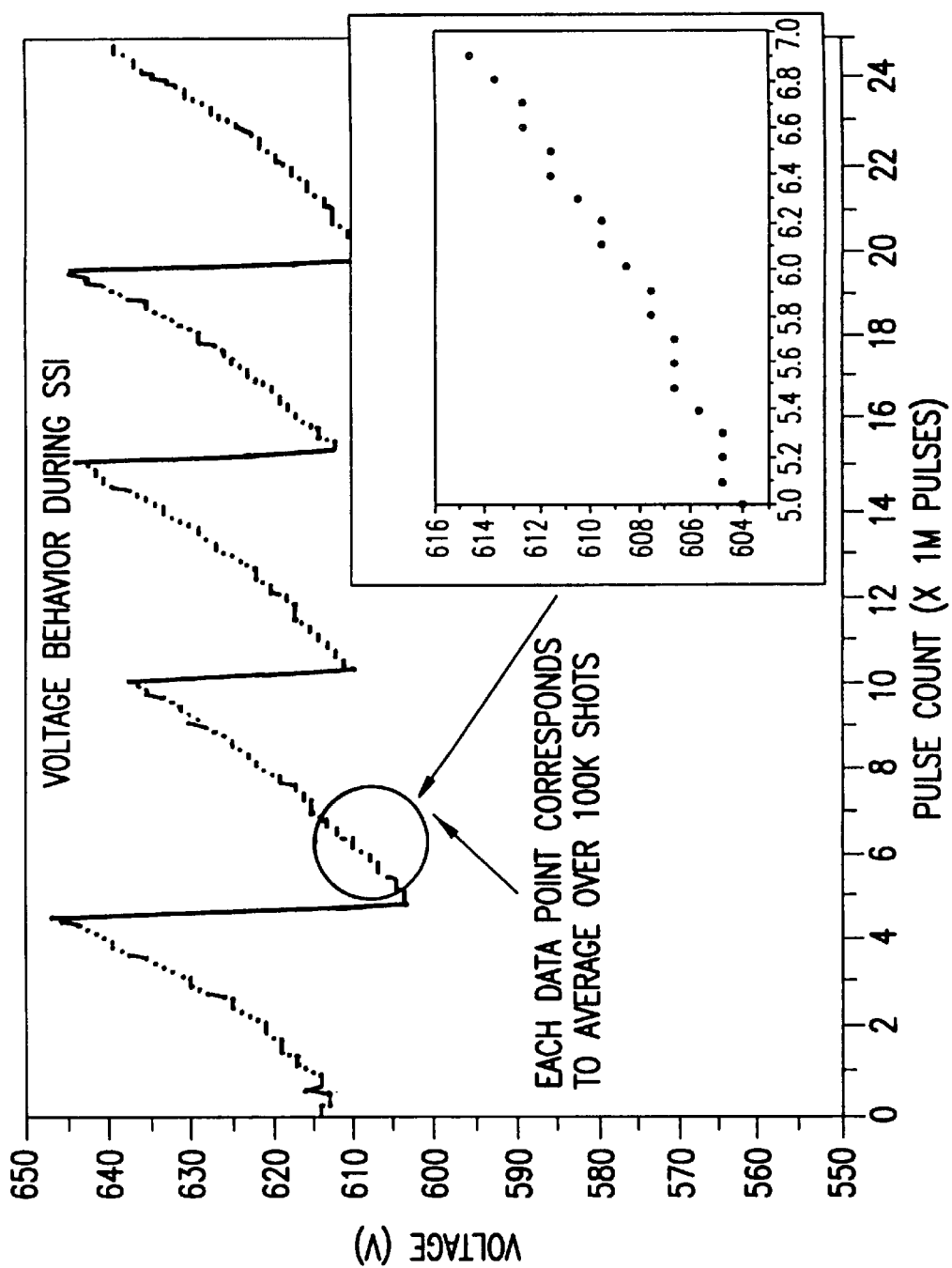
FIG. 2 is a graph showing a widely used prior art method of fluorine concentration control.

As stated in the background section and shown in FIG. 1, the discharge voltage needed to maintain a desired pulse energy is a monotonically decreasing function of fluorine concentration within the desired operating range of the laser. The prior art has demonstrated as shown in FIG. 2 that fairly large swings of discharge voltage and fluorine concentration are possible while keeping the pulse energy output substantially constant. However, wide swings of the discharge voltage and fluorine concentration can result in variations in important laser beam parameters such as wavelength, bandwidth, energy sigma (a measure of the small pulse to pulse energy variations) pulse time profile and spatial profile. Generally there will be a "sweet spot" on the discharge voltage—fluorine concentration (at constant energy) graph at which the above beam parameters are optimized. Such "sweet spot" may be chosen based by the laser operator making trade-off decisions regarding which of the beam parameters are more important while keeping all beam parameters within desired specification ranges. A process for determining the "sweet spot" is described in U.S. patent application Ser. No. 08/915,030 which is incorporated herein by reference.

This process is summarized as follows:
1. Fill the laser with a quantity of fluorine such that the desired pulse energy will be produced with a charging voltage near the upper limit of the charging voltage range.
2. Measure charging voltage (or use control voltage as an excellent estimate of the actual charging voltage), line width and energy sigma.
3. Bleed laser gas (which is about 0.09% fluorine) until the chamber pressure decreases 2 kPa. Increase the fluorine concentration by adding sufficient at 1% fluorine to increase the chamber pressure 2 kPa.
4. Repeat step 2.
5. Repeat steps 3 and 4 until the discharge voltage is near its bottom limit.
6. Plot the data and select the fluorine concentration sweet spot.

Figure 10:
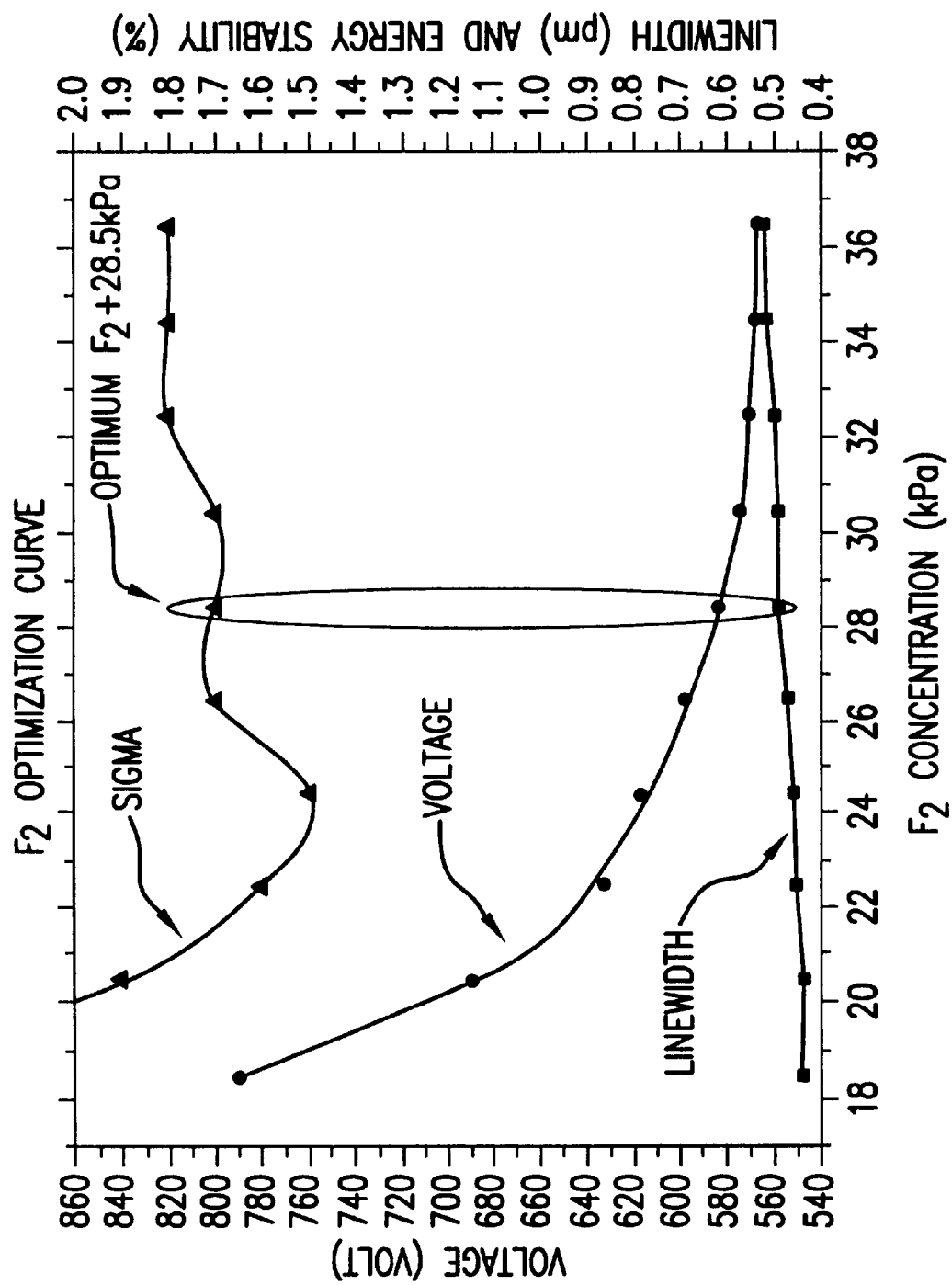
FIG. 10 shows how a desired sweet spot is determined.

Table I shows a typical set of data and this data is plotted in FIG. 10 and a sweet spot of 28.5 kPa (representing 1% $F_2$) about 285 Pa (pure fluorine) is chosen.

TABLE I

| Number of Injects | Cumulative F2 pressure (IcPa) | Average Voltage (Volts) | Linewidth (pm) | Energy Sigma (%) |
|---|---|---|---|---|
| 0 | 18.5 | 790 | 0.44 | 2.5 |
| 1 | 20.5 | 690 | 0.44 | 1.9 |
| 2 | 22.5 | 632 | 0.45 | 1.6 |
| 3 | 24.5 | 618 | 0.46 | 1.5 |
| 4 | 26.5 | 598 | 0.47 | 1.7 |
| 5 | 28.5 | 584 | 0.49 | 1.7 |
| 6 | 30.5 | 575 | 0.49 | 1.7 |
| 7 | 32.5 | 571 | 0.5 | 1.8 |
| 8 | 34.5 | 568 | 0.51 | 1.8 |
| 9 | 36.5 | 567 | 0.52 | 1.8 |

Operating within Fluorine "Sweet Spot" Without Fluorine Monitor

Once the sweet spot is determined, operation within it could be accomplished by:
(1) monitoring the pulse energy and providing a feedback mechanism to very rapidly and automatically adjust the discharge voltage as necessary to keep the pulse energy within a desired very narrow range and
(2) then monitoring the discharge voltage (or control voltage) and injecting fluorine as necessary to keep the discharge voltage within a desired sweet spot corresponding to a desired fluorine concentration as determined by the curve of charging voltage vs. fluorine concentration.

Figure 5:
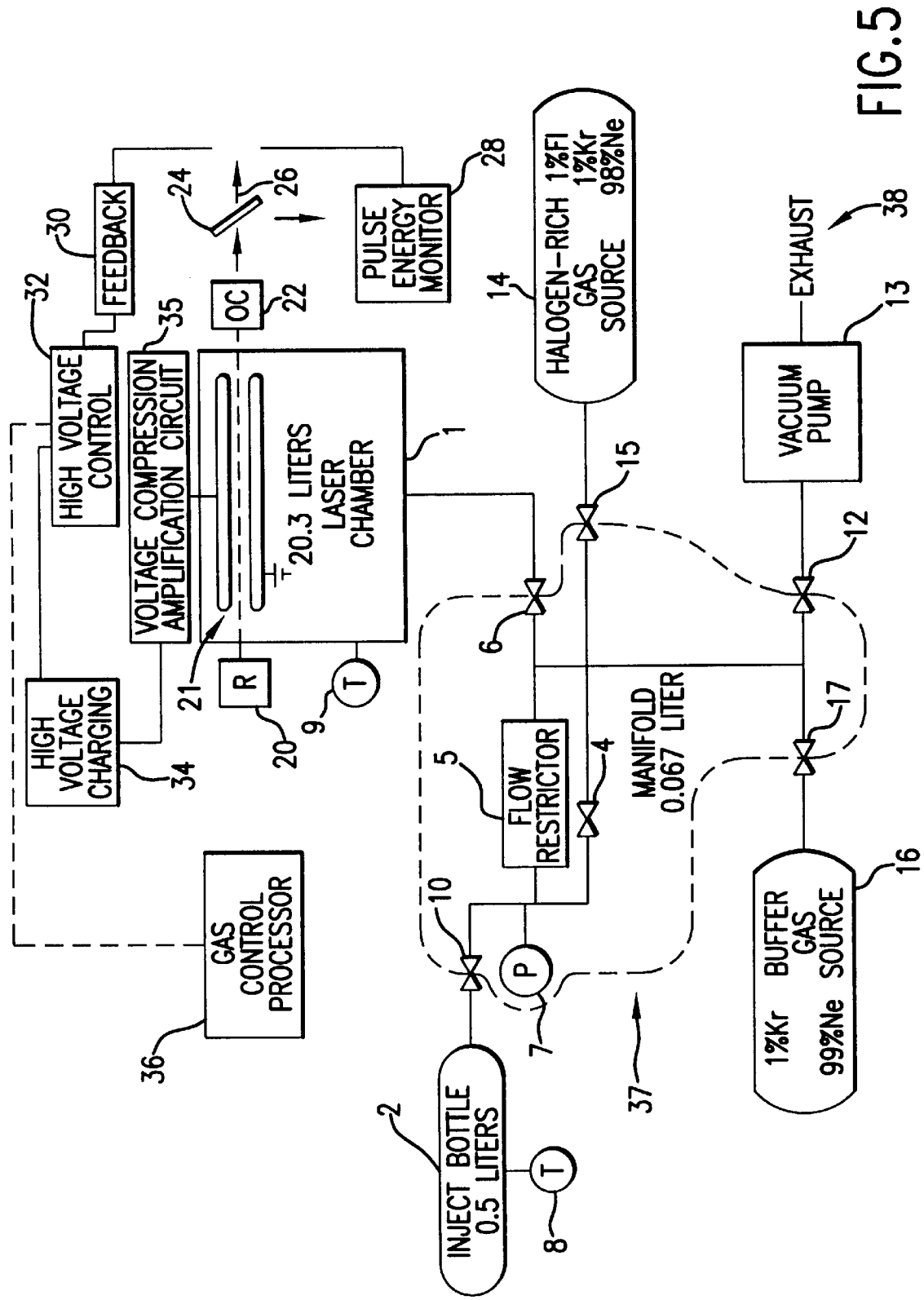

One method to attempt to operate within the "sweet spot" would be to inject fluorine continuously at the same rate as it is being depleted. A feedback loop based on discharge voltage would control the fluorine flow. Such a system requires precision flow control valves and complicated control systems. A simpler method for staying within the sweet spot is shown in FIG. 5. This system provides automatic control and is designed for precisely controlled periodic fluorine injections at intervals as low as about 3 to 5 minutes. As indicated above, for a typical modern 1000 Hz, 10 mJ lithography KrF excimer laser, a the fluorine depletion rate for operation at a load factor of 40% would be about 3.3 mg per hour or 55 micrograms per minute. This decrease in the fluorine concentration would require an increase in the discharge voltage of 800 volts per hour or about 66 volts for each five minutes (assuming no fluorine is added). For example, a voltage increase of about 18,000 volts to about 18,066 volts during a five minute period would be typical. This increase in the discharge voltage is accomplished by increasing the high voltage charging voltage by a corresponding increment (such as from 600 volts to 610 volts). Thus, if the sweet spot corresponds to a 605 volt charging voltage at a pulse energy of 10 mJ, the system in FIG. 5 is programmed to adjust the charging voltage as necessary to control the pulse energy to 10 mJ per pulse until the voltage increases to 610 volts as the result of fluorine depletion. At this point about 290 micrograms of fluorine is injected which improves the efficiency of the laser so that the pulse energy discharge voltage feedback circuit automatically causes the voltage to decrease to about 600 volts, then as further depletion of fluorine occurs the voltage will gradually increase to 610 volts again at which time another injection will be called for. This sweet spot would be about 2 percent of the nominal voltage, a very great improvement over prior art techniques such as that shown in FIG. 2 where the voltage swings are about 8 percent.

Normal Automatic Operations Procedure

By reference to FIG. 5, this process is accomplished as follows. Laser chamber is filled to about 3 atmospheres (290 kPa) with the lasing gas mixture discussed above (i.e., 0.1% Fl, 1.0% Kr and 98.9% Ne). This produces lasing in an optically-resonant cavity consisting of reflecting element 20 and output coupler 22 as a result of periodic discharges between electrodes 21. Laser beam 26 exits the laser through output coupler 22, and a small portion of the beam is extracted with beam splitter 24 and directed to pulse energy monitor 28 which is a fast photodiode. A feedback signal is sent through circuit 30 to high voltage control processor 32 which regulates the high voltage charging system 34 which provides a controlled high voltage input in the range of about 500 volts to about 900 volts (depending primarily on the fluorine concentration, the time since the last refill and the age of the laser components) to voltage compression and amplification circuit 35 which compresses and amplifies the high voltage from high voltage charging system 34 to very short discharge pulses in the range of about 11,000 volts to 20,000 volts across electrodes 21.

As indicated by FIG. 1, the magnitude of the discharge voltage pulse needed to produce a desired pulse energy such as 10 mJ depends substantially on the fluorine concentration and for this type of laser. The operating voltage range should preferably be determined by the performance of a test (discussed above) in which the fluorine concentration is allowed to vary over the possible operating range with a corresponding variation in the discharge voltage and pulse parameters measured to determine the "sweet spot" for the particular laser. Once the sweet spot has been determined (for example, 600 volts to 610 volts) the laser can be controlled automatically within the sweet spot using the system described in FIG. 5.

Sufficient fluorine is injected into the chamber to permit the laser to produce the desired pulse energy with a charging voltage lower than the upper limit of the sweet spot voltage. With valves 10, 6, 4, 15, 17 and 12 closed, the laser is operated with the high voltage control 22 controlling the charging voltage to produce the desired pulse energy until fluorine depletion causes the charging voltage to increase to the upper limit of the sweet spot voltage, in this case 610 volts. Gas control processor 36 monitors the high voltage values utilized by high voltage control 32 and when 610 volts is reached. (In this embodiment, an average of 10,000 control voltage values are averaged to establish the discharge voltage. At 1,000 Hz this takes 10 seconds.) Processor 36 opens valve 6 then reads the chamber pressure from a pressure transducer 7 after its signal stabilizes. Stabilization requires about 10 seconds. If the chamber pressure is higher than the pre-inject target pressure (e.g., 290 kPa), gas control processor 36 using a predetermined value of $\Delta P/\Delta T$ will calculate the time necessary then the processor will cause valve 12 to open for time necessary to reduce the chamber pressure to 290 kPa then it closes valve 12. Valve 12 may be blipped in little steps. Processor 36 waits 10 seconds for the pressure to stabilize and reads the chamber pressure again from a signal from transducer 7. The process may be repeated but if it is the laser operator is informed to check the predetermined $\Delta P/\Delta T$ timing value for valve 12. Also the processor can be programmed to update values of $\Delta P/\Delta T$ based on measurements during bleed periods.

After the preinject chamber pressure is determined to be about 290 kPa or less. Valve 6 is closed and valves 15, 10 and 4 are opened and inject bottle 2 is pressurized to $$\Delta kPa \approx \frac{(\text{INJECT SIZE}) (\text{CHAMBER VOLUME})}{(\text{INJECT BOTTLE}) (\text{PLUS MANIFOLD VOLUME})}$$

in excess of the chamber pressure with halogen rich gas from gas bottle 14. This gas bottle 14 contains a mixture of 1% Fl, 1% Kr and 98% Ne. Valves 15 and 4 are then closed and valve 6 is opened permitting gas from inject bottle 2 and manifold 37 to flow into laser chamber 1. The volume of gas in bottle 2 and manifold 37 is 0.567 liters and the gas will flow until the pressure is equalized in the chamber, manifold and inject bottle. Assuming an initial chamber pressure of 290 kPa, the new pressure (neglecting possible temperature effects) will be about:

$$P = \frac{20.3\ l}{20.867\ l}(290\ \text{kPa}) + \frac{0.567\ l}{20.867\ l}(310\ \text{kPa})$$
$$P = 290.54$$

$$\left(\frac{.54\ \text{kPa}}{290\ \text{kPa}}\right)(20.3\ l) = 37\ \text{ml}$$

Since the halogen rich gas source is only 1% fluorine, the actual volume of fluorine added is only about 0.37 ml (again at the chamber pressure of 290 kPa). A volume of 0.37 ml of fluorine at 290 kPa represents a mass of fluorine of 1.5 mg. Since in this example, the normal depletion rate of fluorine is in the range of about 3.3 mg/hr. this addition of fluorine would be sufficient to compensate for depletion for a period of 27 minutes so that to maintain substantially constant fluorine concentration with injections of this magnitude, injection would occur at intervals in the range of about 27 minutes. Processor 36 is programmed to begin the injections each time the high voltage control voltage (which preferably is averaged over about 10,000 pulses) reaches the upper limit of the sweet spot voltage range when the laser is operating.

The system may include flow restrictor 5, which preferably includes a needle valve, which can be manually adjusted to control the rate of flow from inject bottle 2 into chamber 1. If desired, it is adjusted to spread out the flow over about 70 to 90% of the interval between injections. By so doing this procedure approaches a continuous injection system but is much simpler. Alternatively flow restrictor 5 could be a computer controlled needle valve with which continuous injection could be even more closely approximated.

Gas Replacement

The process described above basically replaces depleted fluorine on an almost continuous basis. Since the fluorine gas source is only 1% fluorine it also replaces a portion of the Kr and Ne in the chamber on an almost continuous basis. Nevertheless, even though a portion of the laser gas is being substantially continuously replaced, operation in this mode results in a build up of contaminants in the laser gas which reduces the efficiency of the laser. This reduction in efficiency requires an increase in the voltage and/or an increase in the fluorine concentration to maintain the desired pulse energy. For this reason, normal practice with prior art systems suggest that periodically the laser be shutdown for a substantially complete gas exchange. This substantially complete gas exchange is referred to as a refill. These periods may be determined based on number of laser pulses such as 100,000,000 pulses between refills, or refill times may be determined based on calendar time since the last refill or a combination of pulses and calendar time. Also the refill times may be determined by the magnitude of the charging voltage needed for a desired output at a particular fluorine concentration. Preferably after a refill a new test for the "sweet spot" should be run. Also, periodically in between fills the sweet spot test should be performed so that if the sweet spot changes the operator will know where the new sweet spot is.

A refill may be accomplished using the system shown in FIG. 5 as follows. With valves 10, 6, 15, 12, 17, and 4 closed, valves 6 and 12 are opened, vacuum pump 13 is operated and the laser chamber is pumped down to an absolute pressure of less than 13 kPa. (A direct pump down line may be provided between the chamber 1 and vacuum pump 13 to permit a quick pump down.) Valve 12 is closed. Valve 16 is opened and 1% Kr, 99% Ne buffer gas from buffer gas bottle 16 is added to the chamber to fill it to a pressure equivalent to 262 kPa at 50° C. (Note that for this 20.3 liter laser chamber, temperature correction can be approximated using a $\Delta P/\Delta T$ correction of 1 kPa/°C. for a chamber temperature deviation from 50° C. So if the chamber temperature is 23° C. it would be filled to 247 kPa.) Valve 17 is closed and valve 15 is opened and a quantity of the 1% Fl, 1% Kr, 98% Ne mixture from halogen rich gas bottle 14 is added to chamber 1 to fill it to a pressure equivalent to 290 kPa at 50° C. (Note the same temperature correction discussed above can be used.) This will produce a gas mixture in the chamber of approximately 0.1% Fl, 1.0% Kr and 98.9% Ne. When the chamber is heated to about 50° C. the pressure will be about 3 atm or 290 kPa.

Fourth Preferred Embodiment

A fourth preferred embodiment uses the same equipment as the third preferred embodiment described above except the procedure is a little different to provide more precise control of injections.

In this case injections are as follows: Valves 12 and 6 are opened and chamber 1 is bled down to 286 kPa. Valves 12 and 6 are closed. Valves 15 and 10 are opened and inject bottle 2 and manifold 37 are filled to 463 kPa. Valve 15 is closed. Valve 6 is opened and gas from manifold 37 and inject bottle 2 are allowed to flow into chamber 1 until the pressure in inject bottle 2 reaches 320 kPa at which time valve 10 is closed. (Gas from bottle 2 flows through flow restrictor 5.) This procedure will consistently add essentially the same precise quantity of fluorine on each inject cycle which in this case is the difference in the quantity of fluorine in the gas bottle at 463 kPa and the quantity in the bottle at 320 kPa plus an additional much smaller quantity represented by the pressure difference in the manifold pressure before equalization and the chamber pressure after equalization. One important advantage of this procedure over the first preferred embodiment is that the much larger differential pressures permit more accurate control of the inject volume because uncertainties associated with pressure measurements have a smaller impact on the precision of the inject. As above flow restrictor 5 controls the flow from inject bottle into the chamber. As discussed above by properly restricting the flow, continuous injection could be approximated. The reader should notice that the ability to approximate continuous flow is improved by making the manifold volume small as feasible in comparison to the inject bottle volume.

In this fourth preferred embodiment the system is preferably automatically controlled by gas control processor 36 to keep the laser operating within a desired sweet spot. The gas control processor calls for a bleed and an inject whenever the charging voltage (averaged over a number of pulses such as 100 pulses) reaches the upper limit of the sweet spot.

If injections are often and small, bleeding prior to each injection is not necessary. Thus, in a modification to this embodiment the processor reads the chamber pressure prior to a bleed-inject operation and if the chamber pressure is below a specified value such as 290 kPa the bleed step is omitted for that iteration.

In another preferred modification to this second embodiment the processor reads the temperature of the inject bottle as indicated by temperature sensor 8 and automatically normalizes to 50° C. the pressure value used for filing inject bottle 2. For example if the temperature of inject bottle 2 is 23° C. the fill pressure of 463 kPa would be adjusted to:

=463 kPa−(48° C.−23° C.) 1.0 kPa/°C.=437 kPa

Separate Exhaust Line

Figure 6:
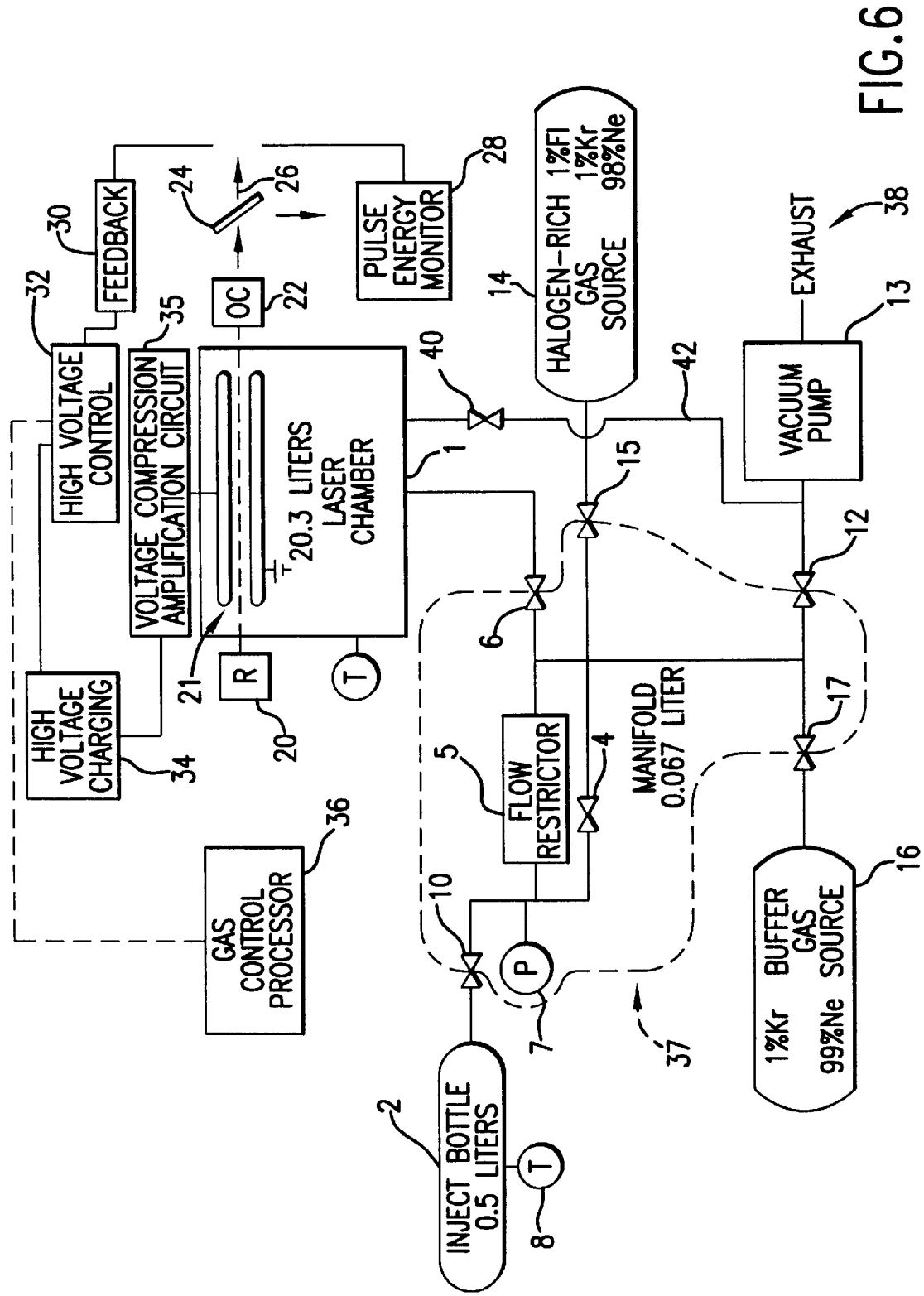

FIG. 6 shows an alternate embodiment which include a separate exhaust line 42 and exhaust valve 40 which permits bleeding directly from the chamber. The advantages of this separate bleed line is that no halogen rich gas which would be in the manifold is lost in the bleed step or in the pump down during a refill. Also, contaminants from the chamber never enter the manifold 37 with this arrangement. Another alternative obvious from FIG. 6 which has been tested by Applicants would be to tie in line 42 to the section of gas pipe between valve 6 and chamber 1. This would avoid cutting an additional port in chamber 1.

Larger Inject Bottle

In another preferred embodiment the size of inject bottle 2 is increased substantially. The advantage is that the same quantity of halogen rich gas can be added with a lower ΔP in the inject bottle. This would also permit better control the rate of flow into chamber 1 through flow restrictor 5. However, a larger bottle would cost more and would mean less precision on the determination of the quantity of $F_2$ injected.

Shotgun Inject

Figure 9:
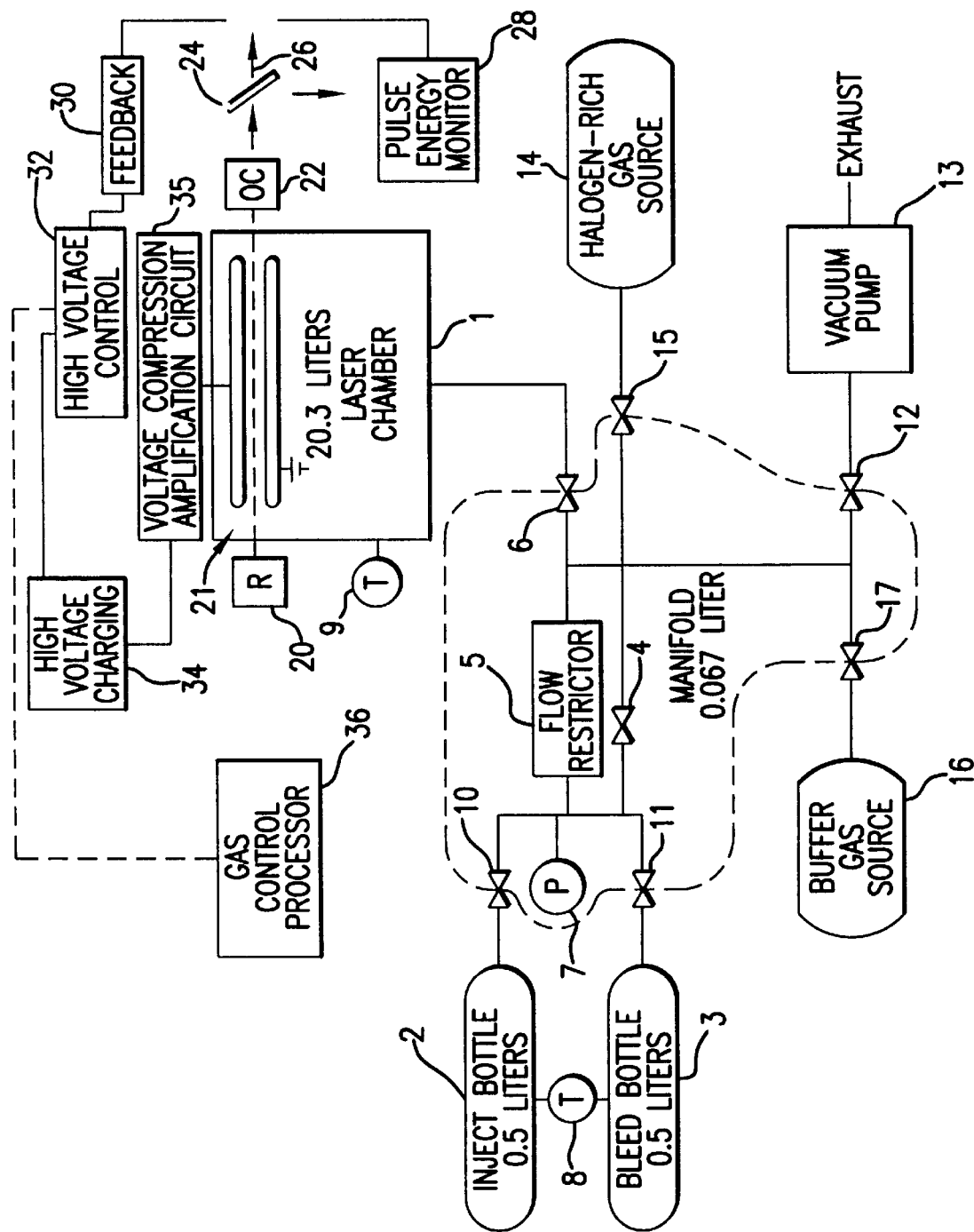

FIG. 9 shows a modification of the FIG. 5 system which includes a 0.5 liter bleed bottle. This arrangement would permit very rapid injects and bleeds. The procedure would be to generally maintain the pressure in inject bottle at a pressure higher than the chamber which is at three atmospheres and the pressure in bleed bottle at a pressure lower than the chamber pressure. For example, the inject bottle could be generally maintained at 5 atms and the bleed bottle maintained at 1 atm. When the laser is not operating, valving between the laser and bleed bottle 3 could be opened and a precise quantity bled in less than 2 seconds. Similarly, the substantially same quantity could be injected in less than 2 seconds in the same way from inject bottle 2.

Circulation Through Inject Bottle

Figure 7:
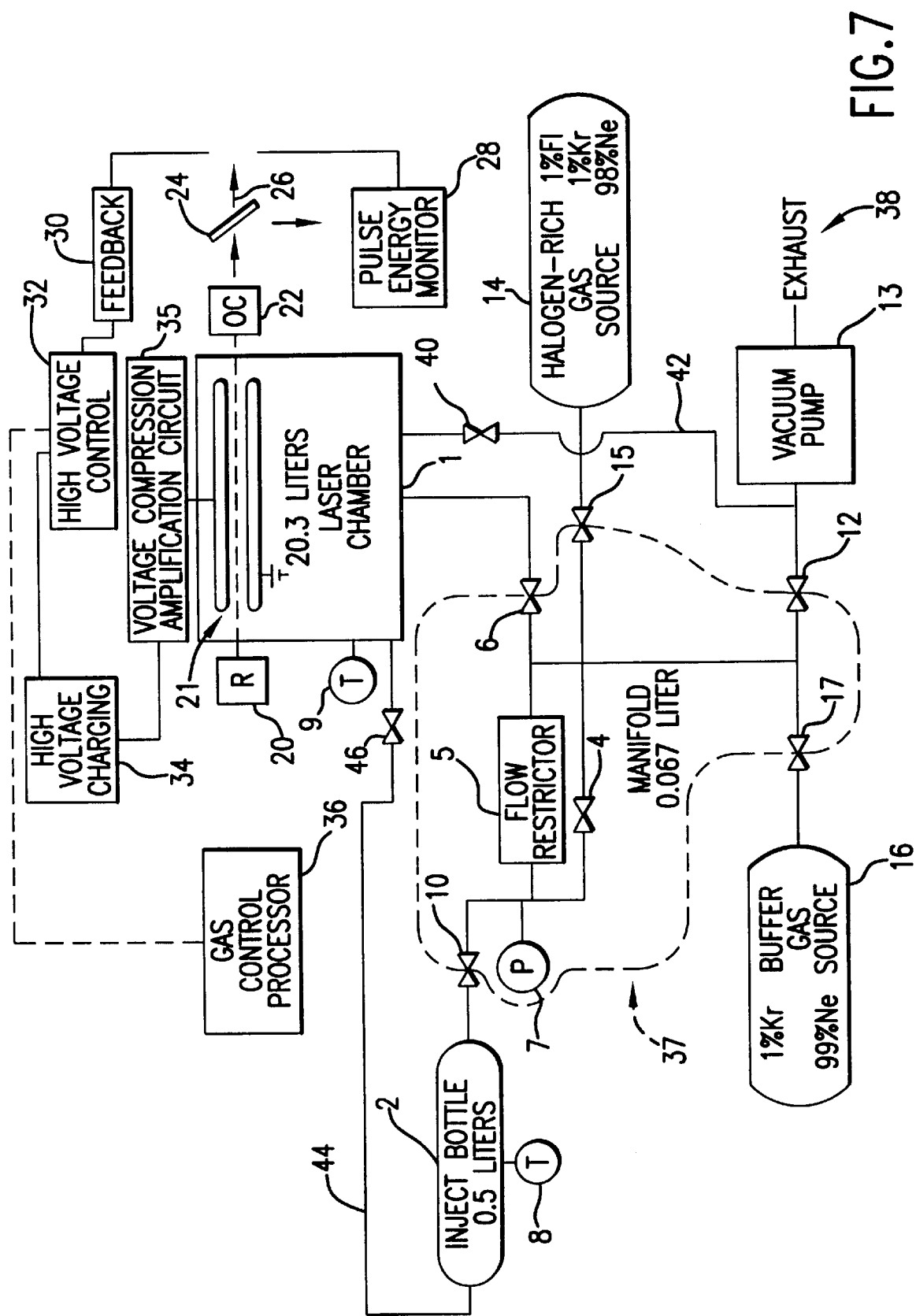

FIG. 7 shows an additional embodiment of the present invention. This embodiment includes valve 46 which line 44 which exits the chamber at a location of relatively high internal gas pressure (such as immediately downstream of the circulation blower). In this embodiment the other gas line would enter the chamber at a location of relatively low internal gas pressure (such as immediately upstream of the circulation blower). This injection process would be to close valve 46 with valves 10 and 6 open to permit the pressure in inject bottle 2 to equalize to the low pressure region of the chamber 1. Valve 6 is closed and valves 15 and 4 are opened to permit bottle 2 to be filled with sufficient halogen rich gas to increase the pressure to about 0.37 kPa above the pressure of the chamber low pressure region, the valves 4 and 15 are closed and valve 6 is opened. When pressure in bottle 2 decreases by about 0.37 kPa as indicated by transducer 7, valve 46 is opened to permit flow through inject bottle 2. Flow restrictor 5 permits careful control of the inject flow to simulate continuous addition of $F_2$ to match depletion.

100% $F_2$ Injection

Figure 8:
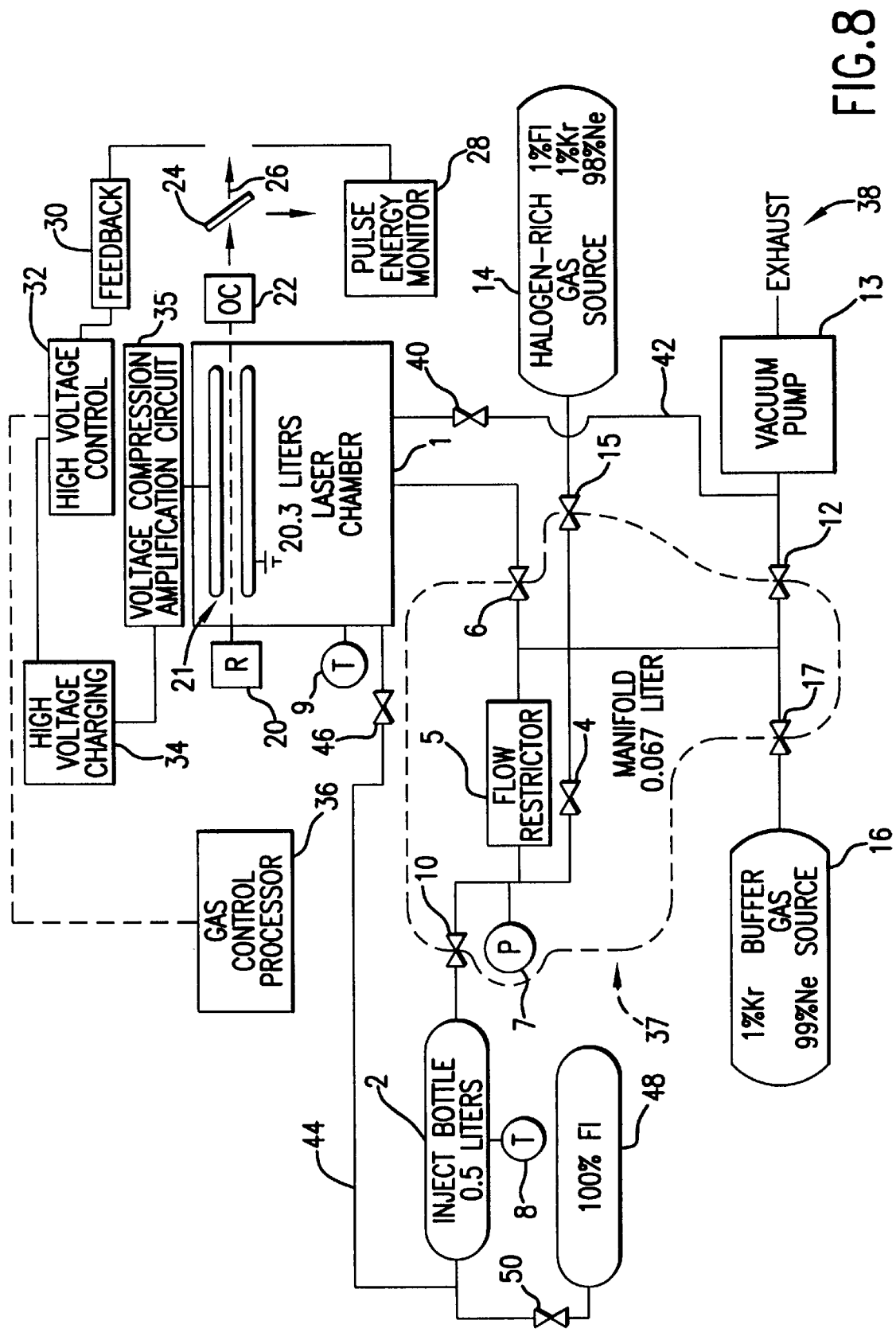

FIG. 8 is a further modification to the FIG. 7 embodiment. In this case, pure fluorine is injected into inject bottle 2 from a 100% fluorine bottle 48 through valve 50. In this case the amount of fluorine injected to compensate for fluorine depletion will be so small that no pressure change will be detected. Therefore, the injection of pure fluorine into inject bottle 2 will be regulated by processor 36 to provide periodic injection through valve 50 to keep the fluorine concentration in inject bottle 2 in the range of about 0.5% to about 3%. Gas processor 36 also controls flow restrictor 5 to keep the high voltage within the desired sweet spot. Gas processor 36 is programmed to increase the injection rate from bottle 48 if flow restrictor 5 approaches the high region of its control range and to lower the injection rate when flow restrictor 5 approaches the low region of its control range.

The reader should recognize that the use of pure fluorine could permit the elimination of 1% fluorine source 14. It would greatly reduce the loss of laser gas Fl, Kr and Ne associated with the bleed down steps. However, refill intervals would probably be more frequent. Fluorine in its 100% form is much less expensive than the same quantity of fluorine in a 1% mixture with neon. But use of pure fluorine presents certain possible hazards and possible regulatory challenges which would have to be dealt with. Persons skilled in this art are able to and should carefully consider the potential tradeoffs associated with the alternative of using pure fluorine.

The 100% fluorine bottle 48 could be located inside the inject bottle 2 and supplied as a replacement item to provide an extra barrier of protection from the dangerous 100% fluorine. If the fluorine contained in bottle 48 (which is inside bottle 2) is no more than the fluorine in a prior art bottle of 1% halogen rich gas such as bottle 14, a good case could be made that there would be no net additional risk associated with the use of pure fluorine. The reader should note that concentrations of fluorine of less than 100% but substantially greater than 1% might be preferable as a compromise of the above trade off considerations.

Increase in Chamber Pressure

A modification to the processes described above would be to permit an increase in the chamber pressure toward the end of chamber life as a method of improving the beam parameters. Whereas the sweetest sweet spot might be at a pressure of 3 atm at the beginning of the life of a chamber, the sweetest sweet spot might be as high as 4 atm or higher at the end of life. Beam parameters and sweet spots vary substantially from chamber to chamber and from time to time for a particular chamber. Therefore, periodic tests, such as once per week, during which pressure fluorine concentration and charging voltages are varied while maintaining energy constant and checking beam parameters will permit the operator to determine the sweetest sweet spots throughout the useful life of each laser.

Multiple Injection Ports

A modification to the system shown in FIGS. 3 through 9 is to provide multiple injection ports in the laser chamber. This could be important when beam parameter specifications are very tight and operation of the laser continues during injection periods. Multiple injection ports would reduce the effects of non-uniform fluorine concentration near the single injection port.

Slope Seeking Injection Method

A very effective method of automatically controlling fluorine concentration without measuring the fluorine concentration makes use of the relationship between charging voltage and $F_2$ concentration shown in FIG. 1 and FIG. 10. As can be seen on these graphs, the slope $\Delta V/\Delta F$ of the V–$F_2$ curve generally decreases with increasing $F_2$ and has the general shape of a negative exponential function. Thus, a given slope $\Delta V/\Delta F_2$ will define a unique $F_2$ concentration. For example, as shown in FIG. 10, the slope of the curve at the 28.3 kPa $F_2$ "sweet spot" is about 5.7 V/kPa. (Note that these values of $F_2$ concentration are in terms of the 1% $F_2$ mixture referred to above and correspond to chamber pressure increases when a quantity of the mixture is injected into the laser chamber.) Therefore, if during operation an amount of $F_2$ is added which is equivalent to 1.0 kPa $F_2$ mixture each time the discharge voltage increases by 5.7 volts from the discharge voltage recorded soon after the previous injection, the $F_2$ concentration in the laser will is after a few injections settle out at 28.5 kPa. Other values of $\Delta V$ and $\Delta F_2$ could be used to force operation at 28.5 kPa. For example if a $\Delta V$ of 40 volts were chosen the corresponding $\Delta F_2$ would be 7.017 kPa which would also provide a $\Delta V/\Delta F_2$ of 5.7 V/kPa.

An $F_2$ "sweet spot" of 24 kPa were chosen, for example, to minimize energy sigma, then the slope which would produce the 24 kPa $F_2$ concentration would be about 10.2 V/kPa. This could be achieved by using a $\Delta V$ of 40 volts and a $\Delta F_2$ of 3.92 kPa.

An alternate method of operating at the 28.5 kPa sweet spot would be to add a specific quantity of $F_2$ (for example, 4 kPa) each time the discharge voltage increases to a $V_1$, for example, 590 volts. This would cause a decrease in the discharge voltage of about 22.8 volts to a $V_2$ of about 567.2 volts and then the voltage would increase gradually over the subsequent 1–3 hours back to $V_1$ of 590 when another 4 kPa would be injected. The disadvantage of this latter method as indicated earlier, is that the laser performance deteriorates between gas refills and generally over its life. Therefore, if voltage is held constant such as between about 590 volts and 567.2 volts, the fluorine concentration would increase to make up for the decrease in laser efficiency so that the laser would not be operating at the $F_2$ sweet spot. On the other hand, keeping $\Delta V/\Delta F_2$ constant instead of keeping a constant $V_1$ will result in a generally increasing $V_1$ and $F_2$ will not change substantially. This turns out to be a very important advantage because beam parameters are much more affected by changes in $F_2$ than by changes in V.

It should now be obvious that an increase in $\Delta V/\Delta F_2$ will cause a decrease in the $F_2$ concentration and an increase in the voltage and the line width should also decrease. Energy sigma will decrease or increase depending on the magnitude of the increase in $\Delta V/\Delta F_2$; all as, for example, shown by an examination of FIG. 10.

Slope Seeking Injection Software

Applicants have developed software to completely and automatically control the laser making use of the slope seeking injection method. With this method, the laser basically controls itself within its best sweet spot for extended periods of time. To best utilize this software, a desired sweet spot should be determined as described above with reference to FIG. 10.

Figure 11:
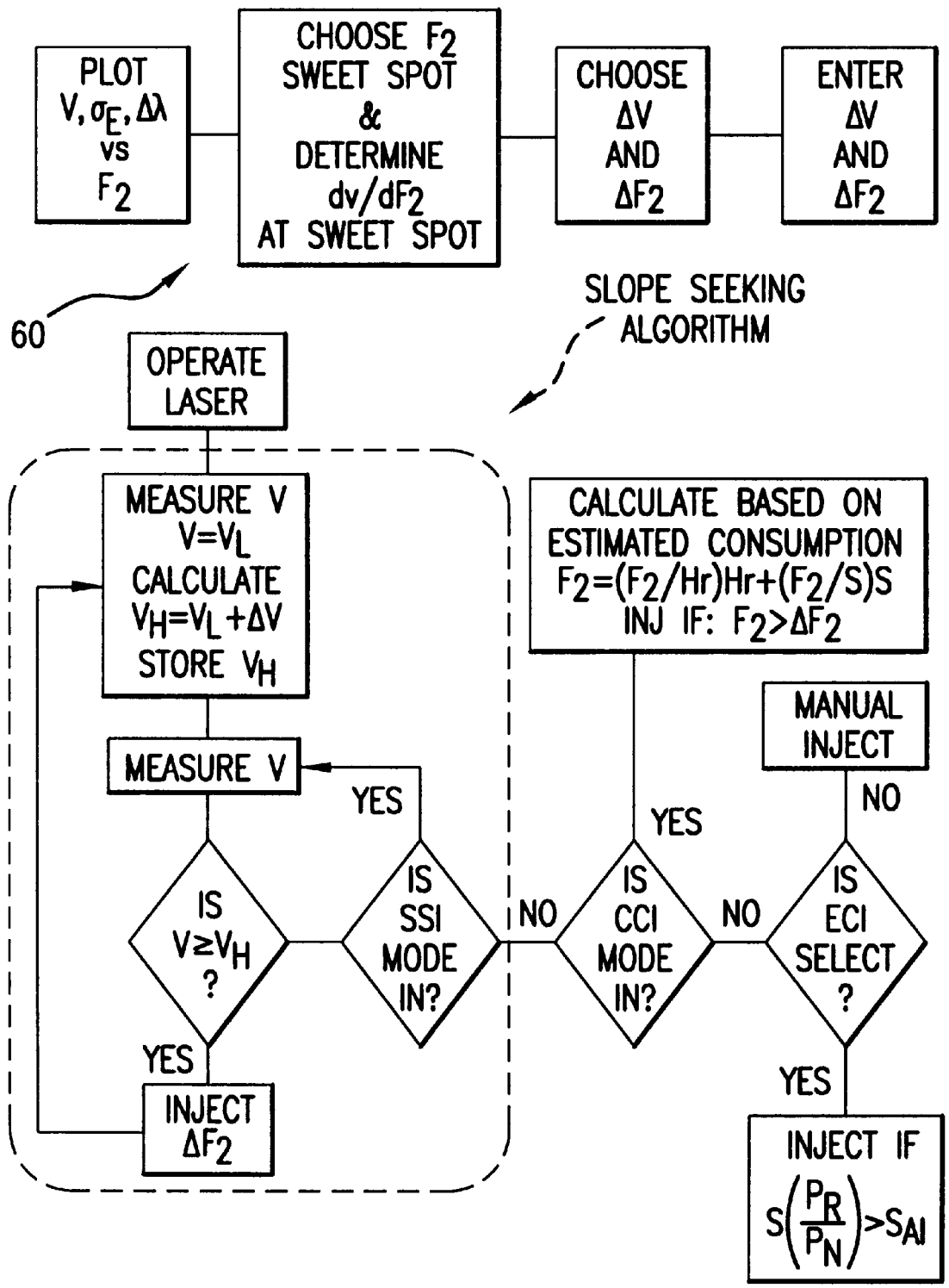
FIG. 11 is a flow chart explaining software of a preferred embodiment of the present invention.

FIG. 11 is a flow chart explaining the basic features of this software for automatic control of the laser. As shown at 60, a fluorine sweet spot and the corresponding $dV/dF_2$ slope are determined and $\Delta V$ and $\Delta F_2$ values are selected and are entered as "configurables" into the computer software.

The laser is operated and a $V_L$ value representing the low edge of a $\Delta V$ is determined using an average value of control voltage and a $V_H$ is calculated and stored. As long as the slope seeking injection mode is in place the processor will loop until the measured value of control voltage is equal to or greater than $V_H$ at which time a precise quantity of $\Delta F_2$ will be injected after which another value of $V_L$ is determined and another value of $V_H$ is calculated and stored for $V_H$. No matter what the concentration of V and $F_2$ are when the SSI mode is initially selected after a few inject cycles the algorithm will force the laser to "seek" or settle in at the V vs. $F_2$ slope determined by $\Delta V$ and $\Delta F_2$ which forces the laser to operate at the chosen $F_2$ sweet spot.

The laser control processor is preferably programmed to branch out of the SSI mode if certain selected conditions of the laser are out of predetermined ranges. For example, a branch out may be called for if the control voltage exceeds 800 volts or temperature conditions within the chamber are substantially out of a desired range. In a preferred embodiment, an alternative CCI mode (compensated consumption injection) provided in which injects are based on estimated $F_2$ consumption based on time an number of shots which are compensated for power deviations. Another preferred alternative mode which may be made available which Applicants call ECI (estimated consumption injection) provides for injections just based on the number of power compensated shots since the last injection. In this alternative the accumulated number of shots are adjusted by a ratio (Pr/Pn) which is the ratio of the average power since the last inject to the laser nominal power. SAI is the average number of shots between injects of nominal power and the amount injected is $\Delta F_2$. A manual inject mode is in place if it is specifically selected or if none of the other modes are in place.

While the invention has been described in detail herein in accord with certain preferred embodiments thereof, many modifications and changes therein may be effected by those skilled in the art. Persons skilled in the art well recognize that the principals discussed above with respect to KrF excimer lasers will apply equally well to ArF excimer lasers. Persons skilled in the art of excimer laser design will also recognize that the feedback control system could be used to purposely vary the fluorine concentration on a substantially real time basis either for the purpose of producing a laser beam having a time variation or for the purpose of maintaining the beam parameters constant in which case the fluorine variation would be chosen to compensate for some effect which would otherwise have produced a time variation in the beam output. Accordingly, it is intended by the appended claims to cover all such modifications and changes as fall within the true spirit and scope of the invention.

What is claimed is:

1. An excimer laser system comprising:
  A) a laser chamber containing:
    1) two spaced apart elongated electrodes;
    2) a laser gas comprising:
      a noble gas,
      fluorine,
      a buffer gas;
  B) a blower for flowing the laser gas between the two spaced apart electrodes;
  C) a high-pressure fluorine source comprising a gas mixture at high pressure, said mixture comprising fluorine, said noble gas and said buffer gas;
  D) a gas inject manifold including an inject bottle having a volume of at least 0.3 liters and providing gas flow communication between said fluorine source and said inject bottle and between said inject bottle and said laser chamber;
  E) a fluorine monitoring means for monitoring changes in fluorine concentration in the chamber substantially continuously at least during laser operation; and
  F) a fluorine feedback control system including at least one low flow fluorine inject flow control valve, said system being programmed to automatically control fluorine flow from said fluorine source into said inject bottle and to control fluorine injection flow from said inject bottle into said laser chamber at a continuous or a substantially continuous rate based on feedback information from said fluorine monitoring means in order to permit said laser to operate within a desired sweet spot determined by fluorine concentration in the laser chamber.

2. An excimer laser system as in claim 1 wherein said fluorine monitoring means comprises a voltage monitor for monitoring a voltage level in a high voltage power system providing high voltage pulses to said elongated electrodes.

3. An excimer laser system as in claim 1 wherein said fluorine and buffer gas in said laser gas in said chamber defines a fluorine-buffer gas chamber ratio and said noble gas and said buffer gas in said laser gas in said chamber defines a noble gas-buffer gas chamber ratio and said fluorine and buffer gas in said fluorine source defines a fluorine-buffer gas source ratio which is substantially greater than said fluorine-buffer gas chamber ratio and said noble gas and said buffer gas in said fluorine source defines a noble gas-buffer gas ratio which is equal to or approximately equal to said noble gas-buffer gas chamber ratio.

4. An excimer laser system as in claim 3 wherein said fluorine-buffer gas ratio is in excess of 5%.

5. An excimer laser system as in claim 3 wherein said fluorine-buffer gas ratio is a ratio corresponding to substantially 100% fluorine.

6. An excimer laser system as in claim 1 wherein the noble gas is krypton and said buffer gas is neon.

7. An excimer laser system as in claim 1 wherein the noble gas is argon and said buffer gas is neon.

8. An excimer laser system as in claim 1 wherein said feedback control system comprises temperature and pressure sensors and a processor programmed to adjust fluorine injection based on temperature deviations from a reference temperature.

9. An excimer laser system as in claim 1 wherein said sweet spot is defined by a slope of a voltage vs. $F_2$ concentration curve.

10. An excimer laser system as in claim 9 wherein said feedback control sytem is programmed to inject fluorine at intervals close enough together to simulate continuous injection in order to permit a voltage defined sweet spot no larger than about 2 percent of the nominal sweet spot voltage.

11. An excimer laser system as in claim 1 wherein said inject bottle has a gas volume of more than 0.5 liters.

12. An excimer laser system as in claim 1 and further comprising a bleed bottle having a volume of more than 0.3 liters.

13. An excimer laser system as in claim 1 and further comprising gas piping permitting gas flow from a relatively high pressure location of said chamber to said inject bottle and from said inject bottle to a relatively low pressure location of said chamber.

14. An excimer laser system as in claim 1 wherein said feedback fluorine control system is programmed to increase the chamber gas pressure as the chamber ages.

15. An excimer laser system as in claim 1 and further comprising multiple injection ports inside the laser chamber for injecting fluorine.

16. An excimer laser system as in claim 1 wherein said fluorine control system comprises a processor programmed with a slope seeking algorithm.

17. An excimer laser system as in claim 1 wherein said fluorine control system comprises a processor programmed with a program for injecting a precise quantity of fluorine, $\Delta F_2$, when discharge voltages have increased by a predetermined increment, $\Delta V$ from a predetermined discharge voltage.

18. An excimer laser system as in claim 17 wherein said discharge voltages are estimated using values of control voltages.

19. A process for controlling fluorine concentration in an excimer laser gas, comprised of at least two noble gases and fluorine, contained in a laser chamber comprising the steps of:
  A) monitoring the fluorine concentration with a real time or substantially real time monitor to provide a real time fluorine concentration value;
  B) periodically calibrating said real time or substantially real time fluorine monitor with a fluorine detector;
  C) providing precise fluorine injections from fluorine source, including fluorine, a noble gas and a buffer gas, through a manifold including an inject bottle into the laser chamber or a continuous or substantially continuous basis;
  D) controlling the fluorine injections with a control system to maintain fluorine concentration within a sweet spot; and
  E) discharging portions of said laser gas from the chamber in order to maintain approximately constant pressure in the chamber.

* * * * *